(12) United States Patent
Banerjee et al.

(10) Patent No.: US 8,305,826 B2
(45) Date of Patent: Nov. 6, 2012

(54) METHOD AND APPARATUS FOR PROGRAMMING AN ANTI-FUSE ELEMENT IN A HIGH-VOLTAGE INTEGRATED CIRCUIT

(75) Inventors: Sujit Banerjee, San Jose, CA (US); Giao Minh Pham, Milpitas, CA (US)

(73) Assignee: Power Integrations, Inc., San Jose, CA (US)

( * ) Notice: Subject to any disclaimer, the term of this patent is extended or adjusted under 35 U.S.C. 154(b) by 197 days.

(21) Appl. No.: 12/800,095

(22) Filed: May 7, 2010

(65) Prior Publication Data
US 2011/0273950 A1 Nov. 10, 2011

(51) Int. Cl.
*G11C 17/00* (2006.01)
*G11C 17/18* (2006.01)
(52) U.S. Cl. ...................................... 365/225.7; 365/96
(58) Field of Classification Search ..................... 365/96, 365/225.7
See application file for complete search history.

(56) References Cited

U.S. PATENT DOCUMENTS

| | | | |
|---|---|---|---|
| 5,282,107 A | 1/1994 | Balakrishnan | |
| 5,285,369 A | 2/1994 | Balakrishnan | |
| 5,977,763 A | 11/1999 | Loughmiller et al. | |
| 6,388,853 B1 | 5/2002 | Balakrishnan et al. | |
| 6,449,207 B2 | 9/2002 | Sher et al. | |
| 6,630,724 B1 * | 10/2003 | Marr | 257/530 |
| 6,635,544 B2 | 10/2003 | Disney | |
| 6,640,435 B2 | 11/2003 | Balakrishnan | |
| 6,668,451 B2 | 12/2003 | Balakrishnan | |
| 6,750,640 B2 | 6/2004 | Balakrishnan et al. | |
| 6,954,057 B2 | 10/2005 | Balakrishnan et al. | |
| 6,987,299 B2 | 1/2006 | Disney et al. | |
| 7,002,398 B2 | 2/2006 | Disney | |
| 7,170,756 B2 | 1/2007 | Balakrishnan | |
| 7,205,824 B2 | 4/2007 | Disney | |
| 7,221,011 B2 | 5/2007 | Banerjee et al. | |
| 7,227,733 B2 | 6/2007 | Balakrishnan et al. | |
| 7,308,754 B2 | 12/2007 | Balakrishnan | |
| 7,335,944 B2 | 2/2008 | Banerjee et al. | |
| 7,336,095 B2 | 2/2008 | Erickson et al. | |
| 7,400,483 B2 | 7/2008 | Balakrishnan et al. | |
| 7,932,738 B1 * | 4/2011 | Banerjee et al. | 324/762.01 |
| 7,998,817 B2 | 8/2011 | Disney | |
| 2010/0163990 A1 | 7/2010 | Ko | |
| 2010/0301412 A1 | 12/2010 | Parthasarathy et al. | |
| 2011/0272758 A1 | 11/2011 | Banerjee et al. | |

* cited by examiner

*Primary Examiner* — VanThu Nguyen
*Assistant Examiner* — Khamdan Alrobaie
(74) *Attorney, Agent, or Firm* — The Law Offices of Bradley J. Bereznak

(57) ABSTRACT

A method for programming a programmable block of a power IC device includes selecting an anti-fuse element of the programmable block to be programmed. The anti-fuse element includes first and second capacitive plates separated by a dielectric layer. A voltage pulse is then applied to a pin of the power IC device. The pin is connected to a drain of a high-voltage field-effect transistor (HVFET) that drives an external load via the pin during a normal operating mode of the power IC device. The voltage pulse, which is coupled to the first capacitive plate of the anti-fuse element, has a potential sufficiently high to cause a current to flow through the anti-fuse element that destroys at least a portion of the dielectric layer, thereby electrically shorting the first and second capacitive plates.

14 Claims, 3 Drawing Sheets

METHOD AND APPARATUS FOR PROGRAMMING AN ANTI-FUSE ELEMENT IN A HIGH-VOLTAGE INTEGRATED CIRCUIT

TECHNICAL FIELD

The present disclosure generally relates to a circuit for programming an anti-fuse element in a high-voltage integrated circuit.

BACKGROUND

A common type of integrated circuit (IC) device is a metal-oxide-semiconductor field effect transistor (MOSFET) that includes a source region, a drain region, a channel region. In high voltage applications, a high voltage MOSFET known as an HVFET (high voltage field effect transistor) maybe used. Many HVFETs employ a device structure that includes an extended drain region that supports or "blocks" the applied high-voltage (e.g., 150 volts or more) when the device is in an 'off' or substantially non-conducting state. Conventional HVFETs are commonly formed as lateral or vertical device structures. In a lateral HVFET, current flow, when HVFET is in an 'on' state, is horizontal or substantially parallel to a surface of the semiconductor substrate. In a vertical HVFET, current flows vertically through the semiconductor material, e.g., from a top surface of the substrate where the source region is disposed, down to the bottom of the substrate where the drain region is located.

Conventional high voltage IC's often employ a large vertical or lateral HVFET in a configuration wherein the drain of the output transistor is coupled directly to an external pin that may be at a high voltage. The high voltage IC device typically includes a controller circuit that operates on low voltage (0 V-12 V) that is separate from the HVFET, but can be still included in the same high voltage IC. To provide start-up current for the controller circuit of the high voltage IC, a high external voltage may be applied to the external pin. The internal circuitry of the device is typically limit-protected from the high externally-applied voltage by a junction field-effect transistor (JFET) "tap" structure. For example, when the drain of the high voltage output transistor is taken to, say 550V, the tap transistor limits the maximum voltage coupled to an internal node to approximately 50 V, and also provides a small (2-3 mA) current for start-up of the controller. By way of further background, U.S. Pat. No. 7,002,398 discloses a three-terminal JFET transistor that operates in this manner.

The operating characteristics of a high voltage IC are typically set by a method known as trimming. More specifically, trimming of high voltage IC typically occurs prior to implementation in a useful circuit to adjust certain parameters. More specifically, the process of trimming may involve selectively closing (or opening) one or more electrical elements that indicates to the controller to adjust certain operating characteristics of the high voltage IC. In one example, the electrical elements used for trimming may be zener diodes. During the process of trimming, one or more zener diodes may be off (non-conducting electrical elements). To change the conducting state of a zener element a voltage (>10 V) is typically applied to breakdown the zener. After breakdown of the zener element a current (150-200 mA) passes between the anode and cathode terminals to short the zener element permanently. The cumulative current flowing through the one or more zener elements may be used to program one or more analog parameters. For example, a zener diode may be used to trim or program an analog parameter such as switching frequency in a high voltage IC used in a switch mode power supply. For example, an analog parameter such as switching frequency may be set within a specified tolerance in the controller section of the power IC by short circuiting one or more zener diodes.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

DESCRIPTION OF EXAMPLE EMBODIMENTS

A method and apparatus for programming an anti-fuse element of a power IC is disclosed. In the following description specific details are set forth, voltages, structural features, manufacturing steps, etc., in order to provide a thorough understanding of the disclosure herein. However, persons having ordinary skill in the relevant arts will appreciate that these specific details may not be needed to practice the embodiments described. References throughout this description to "one embodiment", "an embodiment", "one example" or "an example" means that a particular feature, structure or characteristic described in connection with the embodiment or example is included in at least one embodiment. The phrases "in one embodiment", "in an embodiment", "one example" or "an example" in various places throughout this description are not necessarily all referring to the same embodiment or example. Furthermore, the particular features, structures or characteristics may be combined in any suitable combinations and/or sub-combinations in one or more embodiments or examples.

It should be understood that the elements in the figures are representational, and are not drawn to scale in the interest of clarity. It is also appreciated that although an IC utilizing mostly N-channel transistor devices (both high-voltage and low-voltage) are disclosed, P-channel transistors may also be fabricated by utilizing the opposite conductivity types for all of the appropriate doped regions.

In the context of the present application a high-voltage or power transistor is any semiconductor transistor structure that is capable of supporting 150 volts or more in an "off" state or condition. In one embodiment, a power switch is a high voltage field effect transistor (HVFET) illustrated as an N-channel metal oxide semiconductor field-effect transistor (MOSFET) with the high-voltage being supported between the source and drain regions. In other embodiments, a power switch may comprise a bipolar junction transistor (BJT), an insulated gate field effect transistor (IGFET), or other device structures that provide a transistor function.

For purposes of this disclosure, "ground" or "ground potential" refers to a reference voltage or potential against which all other voltages or potentials of a circuit or IC are defined or measured. A "pin" provides a point of external electrical connection to an IC device or package, thereby allowing external components, circuits, signals, power, loads, etc., to be coupled to the internal components and circuitry of a high voltage IC.

It is further appreciated within the context of this disclose that a 'high' voltage is defined as a voltage that is substantially 150 V or greater, a 'medium' voltage is defined between 150 V and 50 V, and a 'low' voltage is defined to be less than 12 V.

Figure 1:
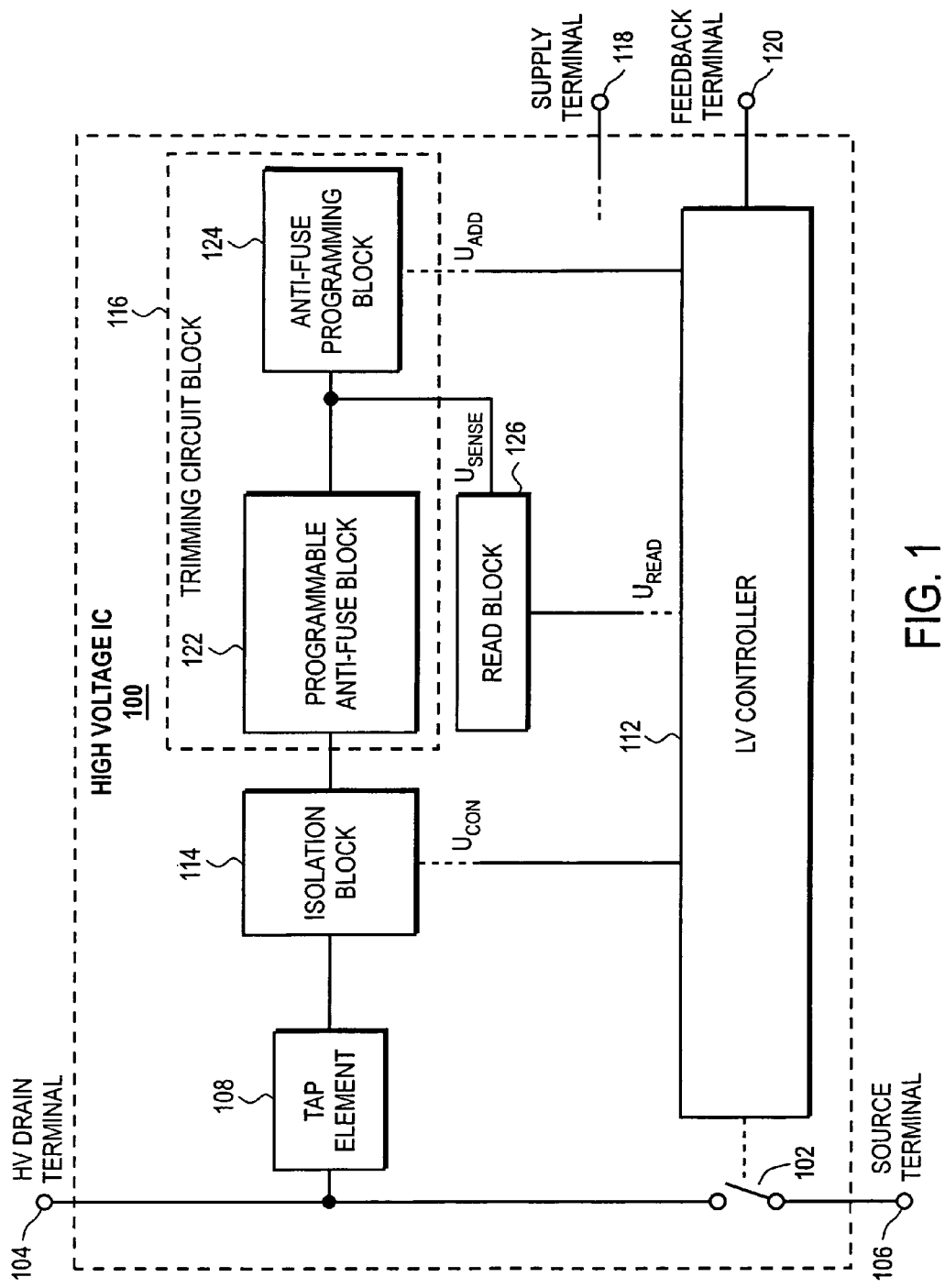
FIG. 1 illustrates an example high voltage IC device block diagram.

As shown, FIG. 1 is a block diagram illustrating an example high voltage IC 100 including a high voltage (HV) switch 102 that may be representative of a high voltage field effect transistor (HVFET) a high voltage (HV) drain terminal 104, a source terminal 106, a tap element 108, a low voltage (LV) controller 112, an isolation block 114, a trimming circuit block 116, a supply terminal 118, and a feedback terminal 120. As shown, high voltage switch 102 is coupled between HV drain terminal 104 and source terminal 106. In one example, high voltage switch 102 may be used in a power supply to control the current through the primary winding of an energy transfer element, such as a coupled inductor. In operation, HV drain terminal 104 is typically coupled to receive input from an external circuit (not shown). As further shown, a source terminal 106 is coupled to another end of HV switch 102. A tap element 108 is coupled to HV drain terminal 104. In operation, tap element 108 provides a buffer between circuitry in high voltage IC 100 and HV drain terminal 104. In one example, tap element 108 includes a three terminal (i.e., electrode) transistor device structure in which a voltage at a first or tap terminal is substantially proportional to an applied voltage across the second and third terminals when the applied voltage is less than a pinch-off voltage of the transistor device. When the applied voltage across the second and third terminals exceeds the pinch-off voltage, the voltage provided at the tap terminal is substantially constant or unchanging with increased applied voltage. In one embodiment, tap element 108 comprises a junction field-effect transistor (JFET). In operation, tap element 108 provides a buffer between HV terminal 104 and internal circuitry in high voltage IC that is rated for much lower voltages. For example, during normal operation HV terminal 104 may be exposed to voltages in excess of 550 V where as the pinch-off voltage (maximum voltage exposed to internal circuitry of high voltage IC 100) is no more than 50 V. In this manner, tap element 108 provides a buffer and prevents other internal elements in high voltage IC from being rated at significantly high voltages which translates into a smaller high voltage IC 100.

As shown, trimming circuit block 116 is coupled to HV drain terminal 104 through isolation block 114. In operation, trimming circuit block 116 allows for a trimming process of high voltage IC 100. More specifically, trimming may involve selectively closing (or opening) one or more electrical elements that indicates to the controller to adjust certain operating characteristics of the high voltage IC. In one example, trimming process may be done on high voltage IC 100 to assure performance meets specifications. According to the present invention, trimming is a process of writing or programming an anti-fuse in response to setting certain operating characteristics of high voltage IC 100. As shown, trimming block 116 includes a programmable anti-fuse block 122, and anti-fuse programming block 124. In one example, programmable anti-fuse block 122 consists of a series or array of anti-fuse structural elements. To be more specific, according to the present disclosure, an anti-fuse is a circuit element that provides a normally open electrical connection in a device structure like that of a capacitor, with two or more layers of metal, polysilicon, or doped semiconductor material separated by a dielectric layer (e.g., oxide, nitride, etc.). The electrical connection between the two layers can be permanently closed by applying a large voltage across two conductors which acts to break down or destroy the dielectric layer, thereby electrically shorting the two metal layers. In operation, programmable anti-fuse block 122 may be programmed through the HV drain terminal 104.

As shown, anti-fuse programming block 124 is coupled to LV controller 112 and programmable anti-fuse block 122. In one example, anti-fuse programming block 124 includes a series of selector switches that are electrically coupled in series with an individually corresponding anti-fuse included in programmable anti-fuse block 122. A selector switch may be any type of transistor or switch that allows current to pass through its corresponding anti-fuse. During a trimming operation, certain selector switches of anti-fuse programming block 124 may be activated (one at a time) to allow a medium voltage (approx. V) to be applied across an anti-fuse, the dielectric of the anti-fuse breaks down and allows current to pass through. In this manner, the selector switches coupled to its corresponding anti-fuse, when activated (turned on), allow the shorting of the anti-fuse. In other words, the anti-fuse is programmed or written when the anti-fuse breaks down and allows current to pass through. During the trimming process, in other words writing of the anti-fuses, the low voltage (LV) controller 112 may output an address signal $U_{ADD}$, which activates selector switches in anti-fuse programming block 124 so that its corresponding anti-fuse may be programmed. As shown, a read block 126 is coupled to programmable anti-fuse block to determine which anti-fuses in programmable anti-fuse block 122 have been programmed or shorted. In this manner, LV controller 112 may make adjustments to operating characteristics of high voltage IC 100.

During programming operation, isolation block 114 is turned "on" to couple an externally-applied medium voltage to anti-fuse block 122. At the same time, one of the selector switches of anti-fuse programming block 124 coupled to a targeted anti-fuse to be shorted is turned on. This allows for the externally-applied medium voltage to be applied across only one anti-fuse at a time, such that one capacitor is shorted at a time. All of the other selector switches in anti-fuse programming block 124 are turned "off". It is appreciated that during normal operation of high voltage IC 100 isolation block disables trimming circuit block 116 from the medium voltage (50 V) at a node 129 of tape element 108.

Figure 2:
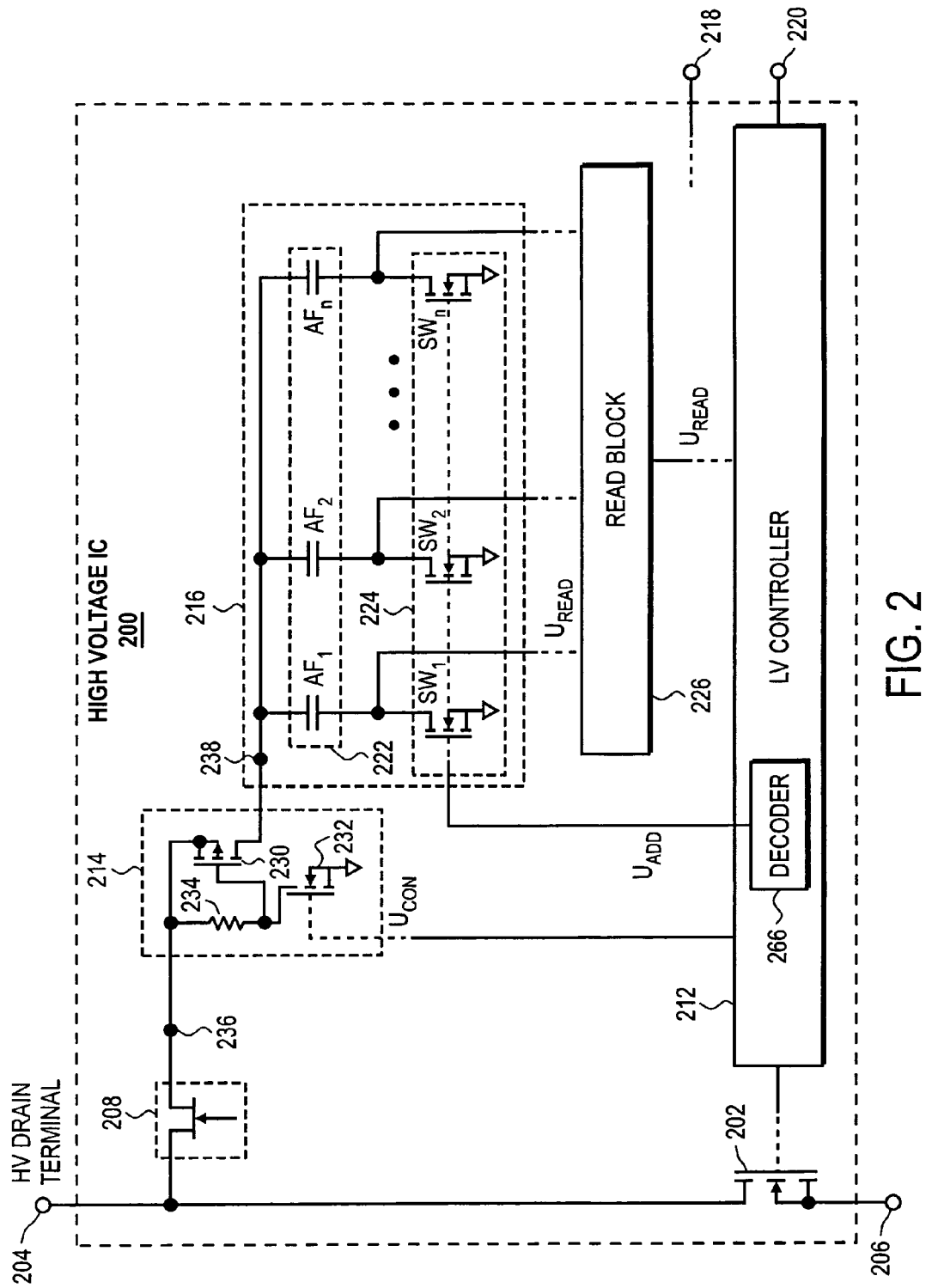
FIG. 2 illustrates an example circuit schematic diagram of the trimming block of FIG. 1

As shown, FIG. 2 further illustrates an example high voltage IC 200. As shown, high voltage IC 200 includes a HV switch 202, a HV terminal 204, source terminal 206, tap element 208, a LV controller 212, a counter/decoder 266, an isolation block 214, a trimming block 216, a supply terminal 218, a feedback terminal 220, a programmable anti-fuse block 222, a switching block 224, and a read block 226. In one example, HV switch 202, tap element 208, LV controller 212, isolation block 214, trim block 216, switching block 224 and read block 226 may be examples of HV switch 102, tap element 108, LV controller 112, isolation block 114, trim block 116, anti-fuse programming block 124 and read block 126, respectively.

As shown, in the example HV IC 200, tap element 208 may include a tap transistor structure that protects circuitry in high voltage IC from voltage greater than approximately 80 V. For example, when the voltage at high (HV) terminal 204 is taken to, say 550 V, the tap transistor limits the maximum voltage at node 229 to approximately 80 V, and also provides a small (2-3 mA) current. In normal operating conditions, isolation block 214 isolates trimming circuit block 216 from the voltage appearing at a node 229. A node 238 of trimming circuit block 216 is shown coupled to node 229 through isolation block 214. As further shown, node 229 also comprises a first or "tap" terminal of tap element 208. A second terminal of tap element 208 is coupled to HV drain terminal 204, which is also coupled to the drain of high voltage switch 202. A third terminal, which is coupled to the gate of the JFET tap transistor structure, is normally grounded.

Persons of skill in the semiconductor arts will appreciate that tap element 208 and high voltage switch 202 may be integrated into a single device structure. It is further appreciated that node 238 may receive a voltage large enough to trim anti-fuses in programmable anti-fuse block 222 from an external voltage source, or an internal voltage source in high voltage IC 200. It is also appreciated that trimming block 216 and LV controller 212 are normally fabricated on the same piece of silicon material.

As shown, isolation block 214 includes a PMOS transistor 230 and an NMOS level shift transistor 232, and a level shift resistor 234. As is further shown, node 229 is coupled to the source of transistor 230 and to one end of resistor 234 of isolation block 214. In one example, PMOS transistor 230 may be rated up to 50 V. The other end of resistor 234 is shown coupled to the gate of transistor 230, and also to the drain of level shift transistor 232. The source of transistor 232 is coupled to ground. Practitioners will appreciate that transistor 230 of isolation block 214 functions to isolate trimming block 216 from medium voltage produced by tap element 208 at node 229 under normal operating conditions.

In operation, level shift transistor 232 and resistor 234 level shift control signal $U_{CON}$ to the gate control signal of transistor 230. More specifically, a connection signal ($J_{am}$ is received at the gate of level shift transistor 232 to turn transistor 232 'on', which, in turn, turns "on" transistor 230, thereby coupling node 229 to 238. In operation, connection signal $U_{CON}$ may connect node 229 to node 238 during a trimming operation, and may disconnect node 229 from 238 during normal operation. In one implementation, the current through level shift transistor 232 and resistor 234 may be designed such that when the transistor 232 is turned on, the gate-to-source voltage of transistor 230 is limited to about 10 V. In certain embodiments, the gate of level shift transistor 232 may be clamped.

As shown, trimming circuit block 216 further includes programmable anti-fuse block 222 and switching block 224. As shown, programmable anti-fuse block 222 comprises multiple programmable anti-fuse elements $AF_1$, $AF_2$ ... $AF_n$, where n is an integer. Each anti-fuse programming element AF is coupled between node 238 and a corresponding selector switch (SW) included in switching block 224. Prior to programming (i.e., trimming), the anti-fuse AF does not pass any current; that is, it appears as an open circuit to a normal D.C. operating voltage (e.g., VDD=5-6 V).

A selected anti-fuse (e.g., $AF_1$) in block 216 may be programmed by turning on the corresponding selector switch (e.g., $SW_1$) in block 224 and then applying a voltage pulse at node 238 (e.g., 30-35 V, 0.5-1.0 mA for 2-5 ms). The voltage required to blow the anti-fuse depends on the gate oxide thickness (e.g., ~30 V for 25 nm oxide). Application of such a high voltage pulse may cause the gate oxide of the anti-fuse structure to rupture, resulting in a permanent short between the top and bottom plate of the anti-fuse $AF_1$, with a resistance typically on the order of a few thousand ohms. The state of anti-fuse $AF_1$ can later be read by sensing its resistance by read block 226. As described throughout this disclosure, the trimming pulse utilized to trim the anti-fuse programming element may be provided externally through the HV drain terminal 204.

Practitioners in the art will appreciate that the amount of current required to trim anti-fuse structure AF is significantly smaller as compared to existing zener diodes, which normally require >150 mA. Additionally, persons of skill in the art will understand that the programmable anti-fuse block disclosed herein may reduce the overall size of the trimming circuit block 216 of high voltage IC 200 by a factor of about five or more as compared to prior art designs. In one embodiment, each anti-fuses AF of programmable anti-fuse block 222 comprises a tiny area of gate oxide, ~10 μm$^2$.

In operation, a programming or trimming HV pulse may be applied to HV drain terminal 204 of high voltage IC 200 and transferred to trimming block 216 through tap element 208 and isolation block 214. As shown, trimming circuit block 216 also includes switching block 224 which comprises multiple selector switches $SW_1$, $SW_2$ ... $SW_n$, each of which is respectively coupled to a corresponding anti-fuse $AF_1$, $AF_2$ ... $AF_n$. In one embodiment, selector switches SW are MOSFETS that may withstand up to 50 V. To program a selected anti-fuse AF, the gate of the corresponding selector switch SW is turned "on" by raising the gate to a high potential while the source is coupled to ground through a low-impedance switch. All of the other selector switches SW (associated with unselected anti-fuses) are off (e.g., gate grounded with their sources coupled to ground through a high-impedance). More specifically, an address signal $U_{ADD}$ is delivered to a corresponding selector switch in switching block 224 that corresponds with the anti-fuse AF that has been selected to be shorted or trimmed. In this manner, LV controller 212 and decoder 266 may output address signal $U_{ADD}$ to isolate and trim the anti-fuse that is picked for trimming.

According to one embodiment, one anti-fuse AF may be trimmed at a time. Multiple anti-fuses AF may be trimmed (shorted), with the trimming of each being performed sequentially. During trimming operations, transistor 230 in isolation block 214 is turned on, which connects programmable anti-fuse block to node 229. A pulsed voltage is then applied to HV drain terminal 204, which causes a lower internal voltage to be produced at node 229. Note that the pulsed voltage applied to HV terminal 204 may be several hundred volts (e.g., 600-700 V), but tap element 208 limits the voltage appearing at node 229 to a much lower voltage potential (e.g., about 50 V).

Persons of ordinary skill will appreciate that high voltage switch 202, which in one embodiment may be a MOSFET, is designed and fabricated to withstand a high pulsed voltage up to approximately 700 V during normal operation. In another example, the gate of selector switch may be pulsed while maintaining a constant high voltage at drain terminal 204. When the a voltage pulse of about 30 V or greater is applied across the selected anti-fuse AF, the gate oxide separating the two terminals or capacitive plates ruptures, thereby programming (shorting) the anti-fuse structure. For the unselected anti-fuses AF—i.e., the ones that are not intended to be blown or shorted—the gate of the corresponding selector switch SW is grounded such that selector switch SW is off. Consequently, the voltage appearing at the bottom capacitive plate (coupled to the drain of selector switch SW) rises in potential, substantially tracking that of the top plate (coupled to node 238). Hence, the gate oxides of the unselected anti-fuses AF are not ruptured and the device structures remain open circuits.

In operation, supply pin 218 that provides power to internal circuit in high voltage IC 200. In one example, supply pin 218 may be coupled to a supply capacitor that is charged by HV drain terminal 204 via tap element 208. In operation, feedback terminal 220 provides information to LV controller 112 such that it may drive high voltage switch 102. In one example, high voltage IC 200 is used in a switch mode power supply and high voltage switch 102 regulates the transfer of energy by limiting a current through the primary winding of a coupled inductor or a transformer.

Figure 3:
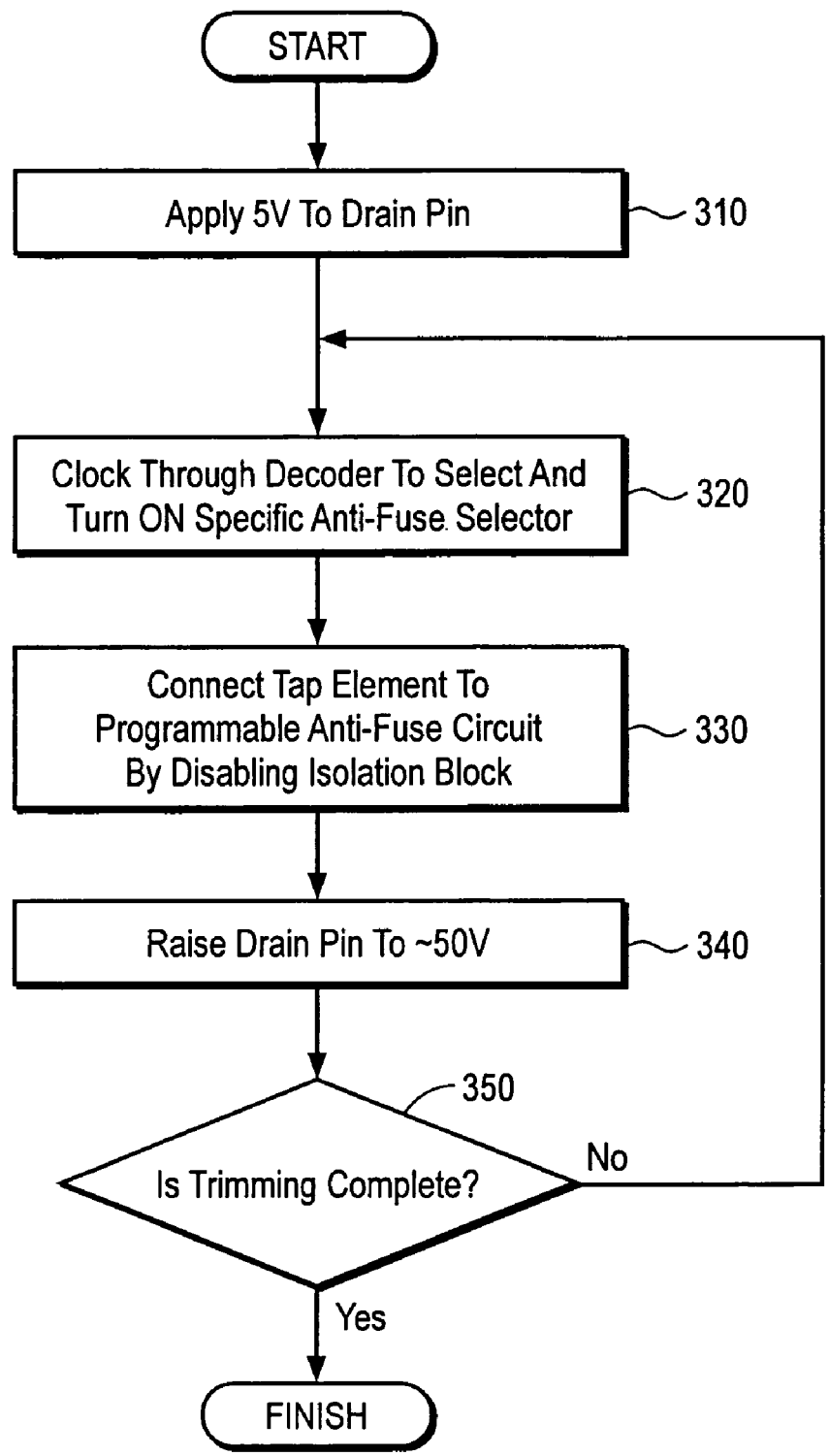
FIG. 3 is an example flow diagram of a sequence of steps for trimming a high voltage IC.

FIG. 3 is an example flow diagram of a sequence of steps for programming an anti-fuse shown in the embodiment of FIG. 2. The sequence begins at block 310 with the application of 5 V to the HV drain terminal 202. This is a safety measure to make sure current is not flowing out of the HV drain terminal 202. In block 320, a counter/decoder 266 may be utilized (e.g., clocked) to select and turn on the appropriate selector switch SW. That is, a voltage is applied to the gate of the selector switch SW that corresponds to the anti-fuse AF selected to be programmed, the gate voltage being sufficiently high so as to turn on that selector switch SW. The other selector switches SW associated with the unselected anti-fuses have their gates coupled to ground to ensure that they remain off.

Next, as shown in block 330, level shift transistor 232 is turned "on", which causes transistor 230 (P1) to turn on. In effect, this allows node 238 to be coupled to node 229 and be at the same voltage potential. HV terminal 204 is then pulsed with a high voltage; that is, node 229 is raised to ~50 V and then lowered back down to 5 V. In one embodiment, a 2 ms duration pulse having a rise time/fall time of ~100 μs may be applied. At decision block 350, if trimming has been completed for all anti-fuses, the process is finished. If further trimming is necessary, then the flow diagram proceeds back to block 320, where the counter/decoder is clocked to select and turn on the next selector switch corresponding to the targeted anti-fuse for trimming.

Although the present invention has been described in conjunction with specific embodiments, those of ordinary skill in the arts will appreciate that numerous modifications and alterations are well within the scope of the present invention. Accordingly, the specification and drawings are to be regarded in an illustrative rather than a restrictive sense.

We claim:

1. A method for programming an anti-fuse memory block of a power integrated circuit (IC) device, comprising:
   applying a first voltage to a pin of the power IC device, the pin being connected to a drain of a high-voltage output field-effect transistor (HVFET) and also to a first terminal of a tap transistor device, a tap voltage being provided at a second terminal of the tap transistor device when an external voltage applied to the pin exceeds a pinch-off voltage of the tap transistor device, the first voltage being less than the pinch-off voltage;
   turning on a trimming MOSFET associated with a selected anti-fuse of the anti-fuse memory block, the selected anti-fuse including first and second capacitive plates separated by a dielectric layer, the first capacitive plate being coupled to a common node of the anti-fuse memory block, the second capacitive plate being coupled to a drain of the trimming MOSFET;
   applying a write signal that causes a source of the trimming MOSFET to be shorted to ground through a low-impedance;
   coupling the second terminal of the tap transistor device to the common node;
   applying a second voltage that is higher than the first voltage to the pin such that a programming voltage is applied to the first capacitive plate of the selected anti-fuse, the programming voltage being high enough to cause a current to flow through the selected anti-fuse sufficient to destroy at least a portion of the dielectric layer, thereby electrically shorting the first and second capacitive plates.

2. The method of claim 1 wherein the second voltage is greater than the pinch-off voltage.

3. The method of claim 1 wherein the write signal is applied to a gate of a low-voltage field-effect transistor (LVFET) having a drain coupled to the source of the trimming MOSFET, a source of the LVFET being coupled to ground.

4. The method of claim 1 wherein the trimming MOSFET has a breakdown voltage that exceeds the tap voltage.

5. The method of claim 1 further comprising turning off all other anti-fuses of the anti-fuse memory block except the selected anti-fuse.

6. The method of claim 1 further comprising clamping the programming voltage across the selected anti-fuse.

7. A method for programming an anti-fuse memory block of a power integrated circuit (IC) device, comprising:
   applying an external voltage to a pin of the power IC device, the pin being connected to a drain of a high-voltage output field-effect transistor (HVFET) and also to a first terminal of a tap transistor device, a tap voltage being provided at a second terminal of the tap transistor device when the external voltage applied to the pin exceeds a pinch-off voltage of the tap transistor device;
   turning on an isolation transistor element to couple the external voltage to a selected anti-fuse element of the anti-fuse memory block, the selected anti-fuse including first and second capacitive plates separated by a dielectric layer, the first capacitive plate being coupled to a common node of the anti-fuse memory block;
   turning on a read/write element coupled to the selected anti-fuse element, thereby connecting the second plate of the selected anti-fuse element to ground;
   coupling the second terminal of the tap transistor device to the common node; and
   applying a pulsed voltage to the pin such that a programming voltage is applied to the first capacitive plate of the selected anti-fuse, the programming voltage being high enough to cause a current to flow through the selected anti-fuse sufficient to destroy at least a portion of the dielectric layer, thereby electrically shorting the first and second capacitive plates.

8. The method of claim 7 wherein the pulsed voltage is greater than the pinch-off voltage.

9. The method of claim 7 wherein the read/write element comprises a low-voltage field-effect transistor (LVFET) having a drain coupled to the source of the trimming MOSFET and a source of the LVFET being coupled to ground.

10. The method of claim 7 further comprising turning off read/write elements associated with all other anti-fuses of the anti-fuse memory block except the selected anti-fuse.

11. The method of claim 7 further comprising clamping the programming voltage across the selected anti-fuse.

12. A method for programming an anti-fuse memory block of a power integrated circuit (IC) device, comprising:
   activating a switching element coupled to a selected anti-fuse element of the anti-fuse memory block, the selected anti-fuse element including first and second capacitive plates separated by a dielectric layer, the first capacitive plate being coupled to an internal node of the power IC device, the switching element being coupled to the second plate of the selected anti-fuse element;

generating a programming voltage at the internal node from an external voltage applied to a pin of the power IC device, the pin being connected to a drain of a high-voltage output field-effect transistor (HVFET), the programming voltage being high enough to cause a current to flow through the selected anti-fuse element sufficient to destroy at least a portion of the dielectric layer, thereby electrically shorting the first and second capacitive plates; and wherein the generating of the programming voltage comprises:

limiting the external voltage to a tap voltage provided at a second terminal of a tap transistor device, the tap transistor device having a first terminal connected to the pin and the drain of the HVFET:

turning on an isolation transistor element to couple the tap voltage to the internal node, the tap voltage comprising the programming voltage.

13. The method of claim 12 wherein the programming voltage comprises a pulsed voltage.

14. The method of claim 12 further comprising clamping the programming voltage across the selected anti-fuse.

\* \* \* \* \*